United States Patent [19]
Livingston

[11] 3,972,747
[45] Aug. 3, 1976

[54] CO-SI-X ALIGNED EUTECTICS
[75] Inventor: James D. Livingston, Schenectady, N.Y.
[73] Assignee: General Electric Company, Schenectady, N.Y.
[22] Filed: Sept. 2, 1975
[21] Appl. No.: 609,592

[52] U.S. Cl. .................................. 148/32; 75/170; 75/171
[51] Int. Cl.² ........................................ C22C 19/07
[58] Field of Search ................ 75/170, 171; 148/32, 148/32.5

[56] References Cited
UNITED STATES PATENTS
3,694,193  9/1972  Carpay et al. ........................ 75/170

Primary Examiner—R. Dean
Attorney, Agent, or Firm—Jane M. Binkowski; Joseph T. Cohen; Jerome C. Squillaro

[57] ABSTRACT
Alloys of Co-Si-X, where X is selected from the group consisting of W, Mo or alloys thereof, are directionally solidified to produce aligned eutectics.

6 Claims, 2 Drawing Figures

CO-SI-X ALIGNED EUTECTICS

The invention described herein was made in the course of, or under, a contract with the Naval Air Development Center, Warminster, Pa.

The art has disclosed the unidirectional solidification of certain metal alloy systems to produce aligned eutectic structures. A eutectic alloy or composition is defined as one which upon being cooled from the liquid state freezes or solidifies at a fixed temperature called the eutectic temperature to produce simultaneously a mixture of two or more types of metallurgical phases.

The present invention relates to the unidirectional solidification of a cobalt-silicon-X alloy, where X is selected from the group consisting of tungsten, molybdenum or alloys thereof, to produce novel aligned eutectics consisting essentially of at least two phases. The present aligned eutectics are substantially or completely free of dendrites and have substantial tensile strength at elevated temperatures of the order of 900°C making them useful for a wide range of applications.

The invention will be better understood from the following description taken in conjunction with the accompanying figures in which.

Figure 1:
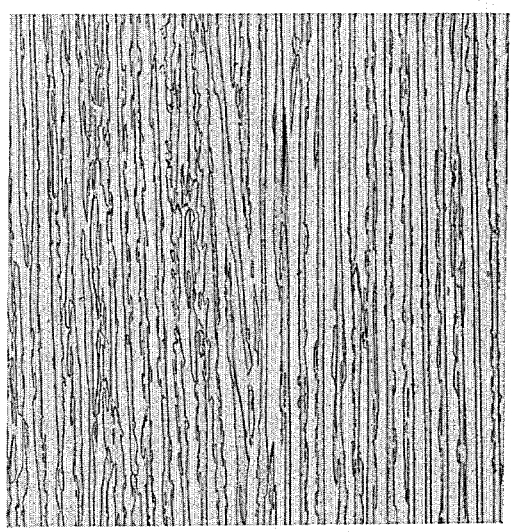
FIG. 1 is a photomicrograph (300 X) of a longitudinal section, growth direction vertical, of a unidirectionally solidified aligned Co-Si-W eutectic of the present invention.

Briefly stated, the present process comprises forming a Co-Si-X alloy body where X is selected from the group consisting of W, Mo or alloys thereof and where the amount of Si ranges from 21 atomic % to 27 atomic % and X ranges from 1 atomic % to 4 atomic %, said alloy having a eutectic temperature at which it solidifies to form a solid alloy having at least two phases, establishing a liquid-solid interface in said alloy body, establishing a thermal gradient ranging from 100°C/cm to 500°C/cm in the liquid at said liquid-solid interface, and unidirectionally solidifying said liquid at said liquid-solid interface at a rate ranging from 0.5 cm per hr to 12 cm per hr.

The aligned eutectic of the present invention is substantially or completely free of dendrites and consists essentially of at least two phases in the form of alternating lamellae significantly parallel to each other and to the thermal gradient. These phases have an average interlamellar spacing ranging from about 2 microns to 20 microns and are substantially uniformly distributed throughout the aligned eutectic.

In the Co-Si-X alloy of the present invention X is selected from the group consisting of W, Mo or alloys thereof. Specifically, the present Co-Si-X alloy contains Si in an amount ranging from 21 atomic % to 27 atomic % and X in an amount ranging from 1 atomic % to 4 atomic %. Alloy compositions outside these ranges do not produce the present aligned eutectics. When X is W, the preferred alloy contains 24 atomic % Si and 2 atomic % W because it produces microstructures free or most free of dendrites.

Generally, in carrying out the instant process, the alloy components are melted together to obtain as uniform a molten mass as possible. The molten mass is then cast by a conventional method to produce an alloy body of the desired size.

The alloy body can be directionally solidified by a number of conventional methods. Generally, the apparatus is comprised of a heated vertical mold provided with a cooling system at its lower end, usually water, and means for controlling the rate of solidification, usually by pulling the ingot-containing mold at a constant rate away from the heat source used to melt the ingot.

Directional solidification is carried out under an inert atmosphere such as argon. Specifically, in carrying out the directional solidification, the alloy body is heated above its eutectic temperature, which generally is about 1200°C, to liquify at least a portion thereof throughout its entire cross-sectional area to establish a liquid-solid interface.

In preparing the aligned eutectic alloy of the present invention, the thermal gradient in the liquid at the liquid-solid interface and the rate of solidification are controlled during unidirectional solidification. Specifically, this thermal gradient is the change in temperature in the liquid per centimeter of length in the liquid phase immediately in front of the liquid-solid interface and ranges from 100°C per cm to about 500°C per cm. The specific thermal gradient used depends largely on the specific rate of unidirectional solidification and to some extent on alloy composition.

The unidirectional rate of solidification, i.e. the number of centimeters of aligned eutectic formed in one hour, ranges from 0.5 cm per hr to 12 cm per hr. Faster rates of solidification require correspondingly higher thermal gradients to maintain significant alignment of the lamellar phases of the present aligned eutectic. Also, the faster the rate of solidification, the finer is the average interlamellar spacing which, in the present invention, ranges from 2 microns to 20 microns.

The aligned Co-Si-X eutectic alloy of the present invention is substantially or completely free of dendrites and consists essentially of at least two phases in the form of alternating lamellae significantly or substantially parallel to each other and distributed substantially uniformly throughout the aligned eutectic. One of the lamellar phases is a Co-rich solid solution phase containing Si in solution, generally in an amount ranging from 8 to 15 atomic %, and may contain X in solution ranging up to the total amount present. The second lamellar phase is a $Co_2Si$ phase or a $Co_2Si$ phase containing X in a minor amount. Generally, each of said lamellar phases is significantly or substantially uniform throughout the aligned eutectic. The present aligned eutectic has an average interlamellar spacing ranging from 2 microns to 20 microns with the finer spacing leading to higher tensile strength but decreased thermal stability. Optimum interlamellar spacing is determined by the particular application and may vary from one application to another. Also, the present aligned eutectic has a minimum tensile strength at 900°C of at least 40,000 psi measured in an inert atmosphere such as argon or a substantial vacuum.

In the Co-Si-X alloy, when X is W, the resulting aligned eutectic of the present invention also contains a third phase which is rod-like in form and which is composed of $Co_3W_2Si$. This third phase is located at the interfaces of the lamellar phases and extends longitudinally through the aligned eutectic. Also, it is distributed substantially uniformly throughout the aligned eutectic.

In one embodiment of the present invention, chromium is substituted in an amount ranging up to 18 atomic % for a portion of the Co in the Co-Si-X alloy to produce an aligned eutectic with improved oxidation and corrosion resistance. The chromium has no significant deleterious effect on the microstructure of the resulting aligned eutectic and generally substantially all of it is present in solid solution in the Co-rich lamellae. The resulting chromium-containing aligned eutectic also has a minimum tensile strength at 900°C of at least 40,000 psi measured in an inert atmosphere such as argon or a substantial vacuum. Amounts of chromium in excess of 18 atomic % tend to have a deleterious effect on the tensile properties of the aligned eutectic.

The present aligned eutectics are particularly useful as high temperature structural alloys such as blades or vanes for high temperature turbines. Specifically, in addition to their substantial tensile strength, the aligned eutectics have a microstructure which is thermally stable, i.e., the microstructure undergoes no significant change in an inert atmosphere such as argon or a substantial vacuum at a temperature up to and including 1100°C. Also, the present aligned eutectics have a surface which is significantly stable, i.e., significantly resistant to oxidation, because of the protective nature of the silicon.

The invention is further illustrated by the following examples:

EXAMPLE 1

A 74 atomic % Co, 24 atomic % Si, 2 atomic % W alloy was formed under argon and cast into a rod ⅜ inch in diameter and 5 inches long.

Conventional apparatus was used to directionally solidify the rod. It included a high frequency induction vertical furnace, a water-cooled copper chill plate and a lowering device. Specifically, the rod was placed in a close-fitting alumina crucible and the resulting assembly placed in the vertical furnace. Directional solidification was carried out under an argon atmosphere. A portion of the rod was melted throughout an entire cross-sectional area and a liquid-solid interface was established at the bottom portion of the rod. A thermal gradient of 750°C/in or 300°C/cm was established in the liquid at the liquid-solid interface. The liquid at the liquid-solid interface was then directionally solidified at a rate of ¼ inch per hr or 0.625 cm per hr.

Figure 2:
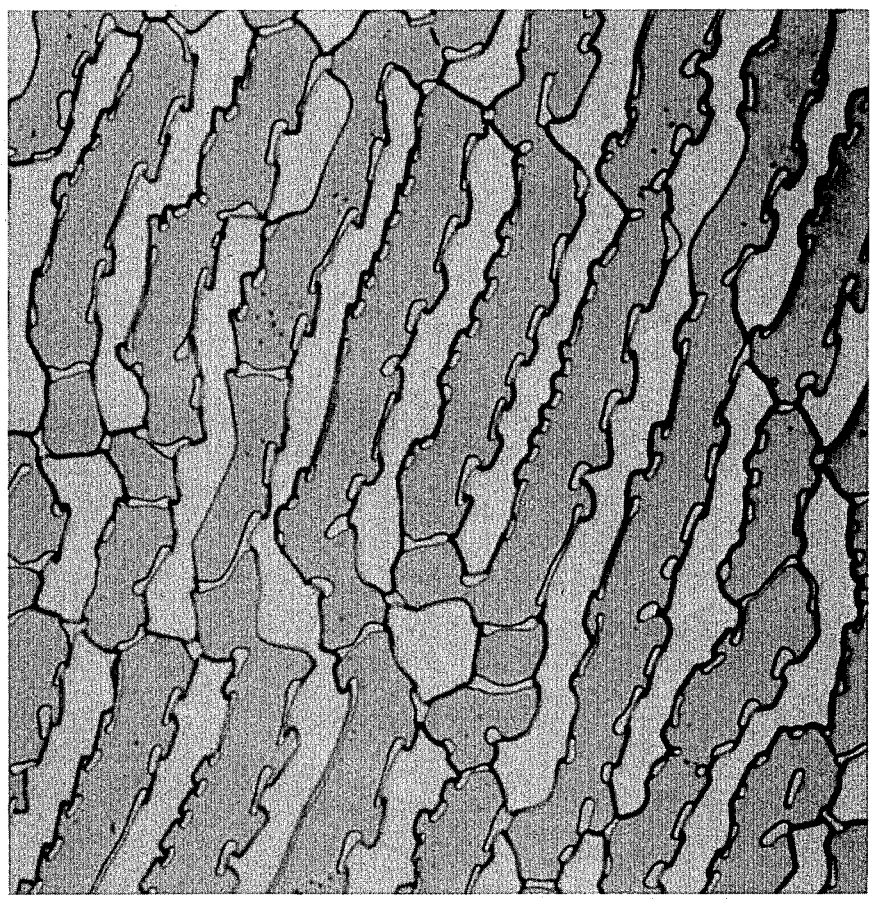
FIG. 2 is a photomicrograph (2500 X) of a transverse section of the Co-Si-W aligned eutectic of FIG. 1 showing three phases. Gray lamellae are $Co_2Si$, white lamellae are Co-rich solid solution, and third phase is $Co_3W_2Si$.

The resulting aligned rod was sectioned longitudinally and transversely and examined using standard metallographic procedure. It had a significantly uniform aligned eutectic microstructure as illustrated in FIGS. 1 and 2 and appeared to be free of dendrites. Specifically, it had three phases, two of which were in the form of alternating lamellae significantly parallel to each other and to the thermal gradient and had an average interlamellar spacing of 8 microns. One of the lamellar phases was a Co-rich phase containing Si and W in solid solution and the second lamellar phase was a $Co_2Si$ phase. The third phase was rod-like in form and was located at the interfaces of the lamellar phases as illustrated by FIG. 2. The third phase was determined to be $Co_3W_2Si$. All of the phases were distributed substantially uniformly in the aligned eutectic.

EXAMPLE 2

An aligned Co-Si-W eutectic rod was prepared as set forth in Example 1. Its tensile properties were determined by a standard technique at a temperature of 900°C in vacuum and are given in Table I.

EXAMPLE 3

An aligned eutectic rod was prepared as set forth in Example 1 except that the alloy composition in atomic % was 68.3 Co, 21.6 Si, 7.4 Cr, 2.7 W.

A portion of the aligned rod was sectioned longitudinally and transversely and examined using standard metallographic procedure. It had a significantly uniform eutectic microstructure and appeared to be free of dendrites.

The tensile properties of the remaining portion of the aligned rod were determined in the same manner set forth in Example 2 and are given in Table I.

TABLE I

| | | TENSILE PROPERTIES AT 900°C | | |
| --- | --- | --- | --- | --- |
| Ex. | Composition (at pct) | 0.1 pct Yield Stress ($10^3$psi) | Ultimate Tensile Strength ($10^3$psi) | Elongation (pct) |
| 2 | 74Co, 24Si, 2W | 58.8 | 64.7 | 8 |
| 3 | 68.3Co, 21.6Si, 7.4Cr, 2.7W | 76.3 | 79.2 | 6 |

Table I shows that the aligned eutectics of the present invention have satisfactory tensile properties at a temperature of 900°C making them useful for a wide variety of high temperature structural applications such as blades or vanes for high-temperature turbines.

The following cited copending patent applications are, by reference, made part of the disclosure of the present application.

In copending U.S. Pat. application, Ser. No. 609,593 entitled "Co-Si-X Aligned Eutectics" filed of even date herewith in the name of James D. Livingston and assigned to the assignee hereof, there is disclosed alloys of Co-Si-X, where X is selected from the group consisting of Ta, Nb, V or alloys thereof, which are directionally solidified to produce aligned eutectics.

In copending U.S. Pat. application, Ser. No. 609,591 entitled "Co-Si-X Aligned Eutectics" filed of even date herewith in the name of James D. Livingston and assigned to the assignee hereof, there is disclosed alloys of Co-Si-X, where X is selected from the group consisting of Al, Ga or alloys thereof, which are directionally solidified to produce aligned eutectics.

What is claimed is:

1. A process for producing an aligned solid eutectic having significant tensile strength which comprises forming a Co-Si-X alloy body where X is selected from the group consisting of W, Mo or alloys thereof and where the amount of Si ranges from 21 atomic % to 27 atomic % and X ranges from 1 atomic % to 4 atomic %, said alloy having a eutectic temperature at which it solidifies to form a solid alloy having at least two phases, establishing a liquid-solid interface in said alloy body, establishing a thermal gradient ranging from 100°C/cm to 500°C/cm in the liquid at said liquid-solid interface, and unidirectionally solidifying said liquid at said liquid-solid interface at a rate ranging from 0.5 cm per hr to 12 cm per hr, said aligned eutectic being substantially or completely free of dendrites and consisting essentially of at least two phases in the form of alternating lamellae significantly parallel to each other and to the thermal gradient and having an average interlamellar spacing ranging from about 2 microns to 20 microns, said phases being substantially uniformly distributed throughout said aligned eutectic.

2. A process for producing an aligned solid eutectic having significant tensile strength according to claim 1 where X is W and wherein there is also a third rod-like phase extending longitudinally through said aligned eutectic at the interfaces between said lamellar phases.

3. A process for producing an aligned solid eutectic according to claim 1 where chromium is substituted in an amount ranging up to 18 atomic % for a portion of the cobalt in said Co-Si-X alloy.

4. A unidirectionally solidified aligned eutectic of a Co-Si-X alloy having significant tensile strength where Si ranges from 21 atomic % to 27 atomic % and where X ranges from 1 atomic % to 4 atomic %, said X being selected from the group consisting of W, Mo or alloys thereof, said aligned solid eutectic consisting essentially of at least two phases in the form of substantially alternating lamellae significantly parallel to each other and substantially uniformly distributed throughout said aligned eutectic having an average interlamellar spacing ranging from about 2 microns to 20 microns, said aligned eutectic being substantially or completely free of dendrites.

5. A unidirectionally solidified aligned eutectic of a Co-Si-X alloy according to claim 4 where X is W and where there is also a third rod-like phase extending longitudinally through said aligned eutectic at the interfaces between said lamellar phases.

6. A unidirectionally solidified aligned eutectic according to claim 4 wherein chromium is substituted in an amount ranging up to 18 atomic % for a portion of the cobalt in said Co-Si-X alloy.

* * * * *